United States Patent
Zandman et al.

(10) Patent No.: US 6,271,060 B1
(45) Date of Patent: Aug. 7, 2001

(54) PROCESS OF FABRICATING A CHIP SCALE SURFACE MOUNT PACKAGE FOR SEMICONDUCTOR DEVICE

(75) Inventors: Felix Zandman, Bala Cynwyd, PA (US); Y. Mohammed Kasem, Santa Clara; Yueh-Se Ho, Sunnyvale, both of CA (US)

(73) Assignee: Vishay Intertechnology, Inc., Malvern, PA (US)

( * ) Notice: Subject to any disclaimer, the term of this patent is extended or adjusted under 35 U.S.C. 154(b) by 0 days.

(21) Appl. No.: 09/395,095

(22) Filed: Sep. 13, 1999

(51) Int. Cl.$^7$ ..................................... H01L 21/44
(52) U.S. Cl. ..................... 438/113; 438/109; 438/465; 438/460
(58) Field of Search ................... 438/113, 109, 438/114, 118, 119, 465, 133, 135–138, 268, 589, 455, 458, 460, 464; 257/678, 626, 621, 508, 786

(56) References Cited

U.S. PATENT DOCUMENTS

| | | | |
|---|---|---|---|
| 3,698,080 | 10/1972 | Berner | 29/583 |
| 4,249,299 | 2/1981 | Stephens et al. | 29/578 |
| 5,270,261 | 12/1993 | Bertin et al. | |
| 5,753,529 | 5/1998 | Chang et al. | |
| 5,757,081 | 5/1998 | Chang et al. | 257/778 |
| 5,767,578 | 6/1998 | Chang et al. | |
| 5,888,884 | 3/1999 | Wojnarowski | 438/462 |

FOREIGN PATENT DOCUMENTS

| | | | |
|---|---|---|---|
| 30 09 985 | 9/1981 | (DE) | H01L/33/00 |
| WO 98/19337 | 5/1998 | (WO) | H01L/21/44 |

OTHER PUBLICATIONS

Lawrence Kren, "The Race for Less Space", Machine Design, Jul. 8, 1999, pp. 86–88 and 90.

Patrick Mannion, "MOSFETs Break Out Of The Shackles Of Wirebonding", Electronic Design, Mar. 22, 1999, vol. 47, No. 6, pp. 1–5.

*Primary Examiner*—Charles Bowers
*Assistant Examiner*—Yennhu B. Huynh
(74) *Attorney, Agent, or Firm*—Skjerven Morrill MacPherson LLP; David E. Steuber

(57) ABSTRACT

This semiconductor surface mount package is relatively inexpensive to produce and has a footprint that is essentially the same size as the die. A conductive substrate is attached to the back side of a wafer and is in electrical contact with a terminal on the back side of each die in the wafer. A nonconductive overcoat is formed and patterned on the front side of the wafer, leaving a portion of the passivation layer and the connection pads for the dice exposed, each of the connection pads being coated with a solderable metal layer. The assembly is then sawed in perpendicular directions along the scribe lines between the dice, but the saw cuts do not extend all the way through the substrate, which remains intact at its back side. The parallel cuts in one direction are broken to produce die strips which are mounted, sandwich-like, in a stack, with one side of the strips exposed. A metal layer is sputtered or evaporated on one side of the stack; the stack is turned over and a similar process is performed on the other side of the stack. The resulting metal layers are deposited on front side of the die and extend along the edges of the die to the edges and back side of the substrate. The metal is not deposited on the surfaces of the overcoat. The strips in the stack are then separated, and the saw cuts in the perpendicular direction are broken to separate the individual dice. A thick metal layer is plated on the sputtered or evaporated layers to establish a good electrical connection between the front side and the terminal on the back side of each die. The resulting package thus includes a metal layer which wraps around the edges of the die to form an electrical connection between a location on the front side of the die and the conductive substrate. The package is essentially the same size as the die. In an alternative embodiment, a nonconductive substrate is used and vias are formed in the substrate and filled with metal to make electrical contact with the terminal on the back side of the die.

35 Claims, 9 Drawing Sheets

PROCESS OF FABRICATING A CHIP SCALE SURFACE MOUNT PACKAGE FOR SEMICONDUCTOR DEVICE

CROSS-REFERENCE TO RELATED APPLICATIONS

This application is related to application Ser. No. 09/395,097 and application Ser. No. 09/395,094, both of which were filed by the same applicants on the same date as this application and both of which are incorporated herein by reference.

BACKGROUND OF THE INVENTION

After the processing of a semiconductor wafer has been completed, the resulting integrated circuit (IC) chips or dice must be separated and packaged in such a way that they can be connected to external circuitry. There are many known packaging techniques. Most involve mounting the die on a leadframe, connecting the die pads to the leadframe by wire-bonding or otherwise, and then encapsulating the die and wire bonds in a plastic capsule, with the leadframe left protruding from the capsule. The encapsulation is often done by injection-molding. The leadframe is then trimmed to remove the tie bars that hold it together, and the leads are bent in such a way that the package can be mounted on a flat surface, typically a printed circuit board (PCB).

This is generally an expensive, time-consuming process, and the resulting semiconductor package is considerably larger than the die itself, using up an undue amount of scarce "real estate" on the PCB. In addition, wire bonds are fragile and introduce a considerable resistance between the die pads and the leads of the package.

The problems are particularly difficult when the device to be packaged is a "vertical" device, having terminals on opposite faces of the die. For example, a power MOSFET typically has its source and gate terminals on the front side of the die and its drain terminal on the back side of the die. Similarly, a vertical diode has its anode terminal on one face of the die and its cathode terminal on the opposite face of the die. Bipolar transistors, junction field effect transistors (JFETs), and various types of integrated circuits (ICs) can also be fabricated in a "vertical" configuration.

Accordingly, there is a need for a process which is simpler and less expensive than existing processes and which produces a package that is essentially the same size as the die. There is a particular need for such a process and package that can be used with semiconductor dice having terminals on both their front and back sides.

SUMMARY OF THE INVENTION

These objectives are achieved in a semiconductor package fabricated in accordance with this invention. The fabrication process starts with a semiconductor wafer including a plurality of dice and includes: forming an overcoat on a surface of the wafer; attaching the wafer to a substrate; patterning the overcoat to expose connection pads on a front side of the dice; forming an electrically conductive wraparound layer on a side of a die, the wraparound layer wrapping around an edge of the die to form at least a portion of an electrical connection between a location on the front side of the die and a terminal on a back side of the die; and breaking the wafer into individual dice.

In one version of the process, the formation of a wraparound layer includes severing the wafer along parallel lines between the dice so as to yield a plurality of multiple-die strips; mounting the strips adjacent to each other, sandwich-like, to form a stack; depositing at least a first metal layer on an exposed side of the stack, the first metal layer wrapping around the edge of each die to form an electrical connection between the front side of the die and an electrical terminal on the back side of the die; disassembling the strips in the stack; separating the individual dice in the strips; and plating a second metal layer over the first metal layer. The first and second metal layers are, in effect, sublayers of a single metal "layer".

The process may include forming a solderable metal layer on the connection pads. The solderable metal layer can be formed, for example, by removing a native oxide layer from the connection pad (e.g., removing aluminum oxide from an aluminum layer) and depositing a solderable metal such as gold, nickel or silver on the exposed metal by sputtering or plating.

The process may also include forming solder or polymer bumps or balls on the connection pads on the front side of the die, thereby enabling the package to be mounted to a PCB using known flip-chip techniques.

In some embodiments, perpendicular saw cuts are made between the dice, the cuts extending partially through the substrate such that the substrate remains intact at its back side. The multiple-die strips are formed by breaking the wafer along a series of parallel cuts. After the first metal layer has been deposited and the stack has been disassembled, the strips are broken into individual dice along the cuts perpendicular to those that were broken to form the strips.

The substrate may be a sheet of a conductive material such as copper or aluminum and may be attached to at least one terminal on a back side of the die with a conductive cement. The conductive substrate may serve as a heat sink as well as an electrical contact. Alternatively, the substrate may be nonconductive, and vias or holes may be formed in the substrate and filled with a conductive material to facilitate electrical contact with the back side of the die.

Typically the first metal layer is a relatively thin layer deposited by sputtering or evaporation and the second metal layer is a relatively thick layer formed by plating. In some embodiments, it may be possible to make the first metal layer thick enough that the second metal layer can be omitted.

In some cases, it may be desirable to make the semiconductor wafer thinner, for example by grinding the back side of the wafer, to reduce the resistance of the semiconductor device. To provide support for the wafer during grinding, the front side of the wafer is initially attached to a supporting substrate, which could be made of a nonconductive material such as glass or a conductive material such as copper. Holes are opened in the supporting substrate to expose the connection pads on the front side of the wafer.

A semiconductor package in accordance with this invention comprises a semiconductor die; a supporting substrate attached to a back side of the die; a nonconductive overcoat overlying a front side of the die, an opening in the overcoat corresponding with a connection pad on the front side of the die, and an electrically conductive wraparound layer (which may include a conductive polymer layer or one or more metal layers or sublayers) extending from the front side of the die, around an edge of the die to the substrate, and thereby establishing an electrical connection between a location on the front side of the die and a terminal on the back side of the die. A solder or polymer bump or ball can be formed on the connection pad.

In one embodiment, the semiconductor package includes a vertical power MOSFET, and the supporting substrate comprises a sheet of copper. The overcoat is patterned so as to expose source and gate pads on the front side of the die. The copper substrate is attached with a conductive cement to a drain terminal on the back side of the die, and the wraparound layer extends around an edge of the die to establish an electrical connection between the front side of the die and the copper substrate. The portion of the wraparound layer on the front side of the die effectively forms a front side drain pad. Solder balls are formed on the source, gate and drain pads. The package can be inverted and mounted, flip-chip style, on a PCB.

In another embodiment, the substrate is nonconductive, and vias filled with a conductive material extend through the substrate to allow electrical contact between the wraparound layer and the terminal on the back side of the die.

Semiconductor packages according to this invention do not require an epoxy capsule or bond wires; the one or more substrates attached to the die serve to protect the die and act as heat sinks for the die; the packages are very small (e.g., 50% the size of molded packages) and thin; they provide a very low on-resistance for the semiconductor device, particularly if the wafer is ground thinner; they are economical to produce, since they require no molds or lead frames; and they can be used for a wide variety of semiconductor devices such as diodes, MOSFETs, JFETs, bipolar transistors and various types of integrated circuit chips.

BRIEF DESCRIPTION OF THE DRAWINGS

This invention will be better understood by reference to the following drawings (not drawn to scale), in which similar components are similarly numbered.

DESCRIPTION OF THE INVENTION

Figure 1:
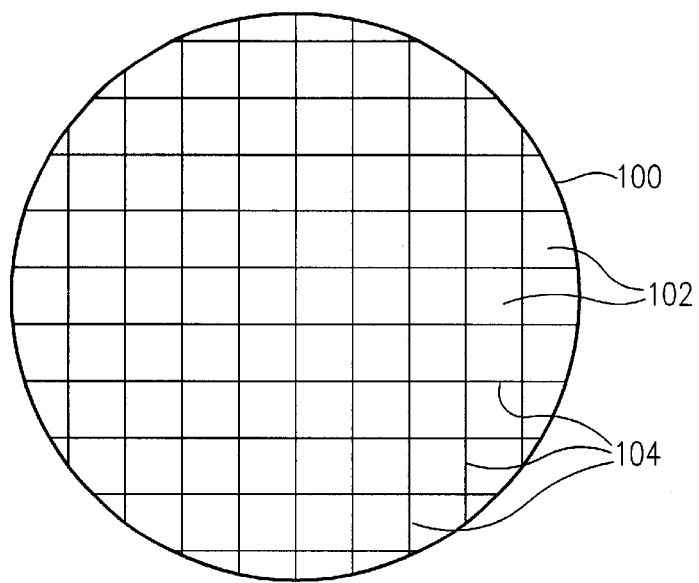
FIG. 1 illustrates a top view of a conventional semiconductor wafer including a plurality of dice.

The processing of a semiconductor wafer yields a rectangular array of dice. This is shown in FIG. 1, which illustrates a top view of a wafer 100 and dice 102. The dice are separated by a perpendicular network of scribe lines 104, where saw cuts are typically made to separate the dice 102.

This invention will be described with respect to a package for a vertical power MOSFET, which typically has source and gate terminals on its front side and a drain terminal on its back side. It should be understood, however, that the broad principles of this invention can be used to fabricate a package for any type of semiconductor die which has terminals both its front and back sides, including diodes, bipolar transistors, junction field effect transistors (JFETs), and various types of integrated circuits (ICs). As used herein, the "front side" of a die refers to the side of the die on which the electrical devices and/or a majority of the connection pads are located; "back side" refers to the opposite side of the die.

A semiconductor die normally has a top metal layer that includes connection pads used for making interconnections with external devices. Typically, this is an aluminum metal layer, although copper layers are also being used. In most embodiments of this invention, this metal layer needs to be modified so that it will adhere to a solder metal such as tin/lead, for the reasons described below. If there is a native oxide layer on the metal, this native oxide layer must first be removed. Then a solderable metal, such as gold, nickel or silver, is deposited on the exposed metal. The removal of the oxide layer and deposition of a solderable metal can be accomplished by means of a number of known processes. For example, an aluminum layer can be sputter-etched to remove the native aluminum oxide layer and then gold, silver or nickel can be sputtered onto the aluminum. Alternatively, the die can be dipped in a liquid etchant to strip away the oxide layer and the solderable metal can then be deposited by electroless or electrolytic plating. Electroless plating includes the use of a "zincating" process to displace the oxide, followed by the plating of nickel to displace the zincate.

Figure 2B:
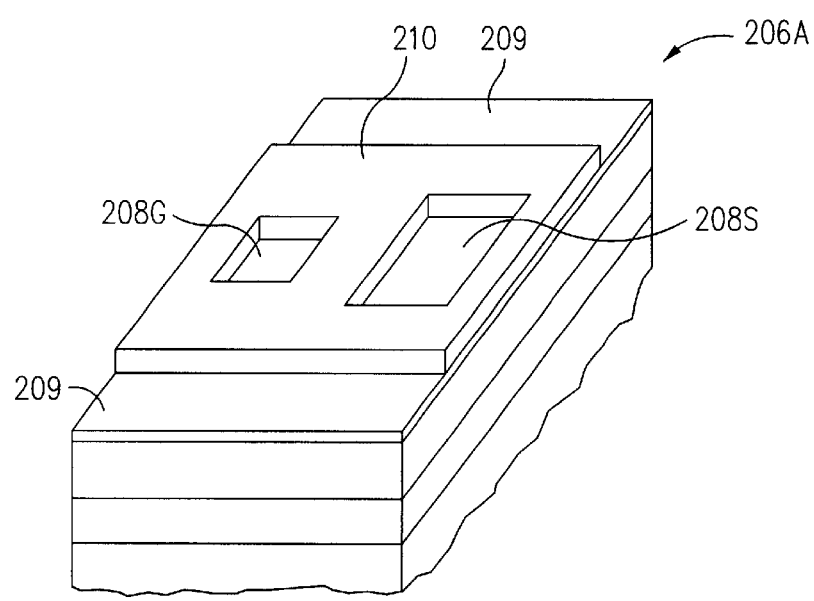
FIG. 2B illustrates a single die of the wafer after the overcoat has been deposited and patterned.
Figure 2A:
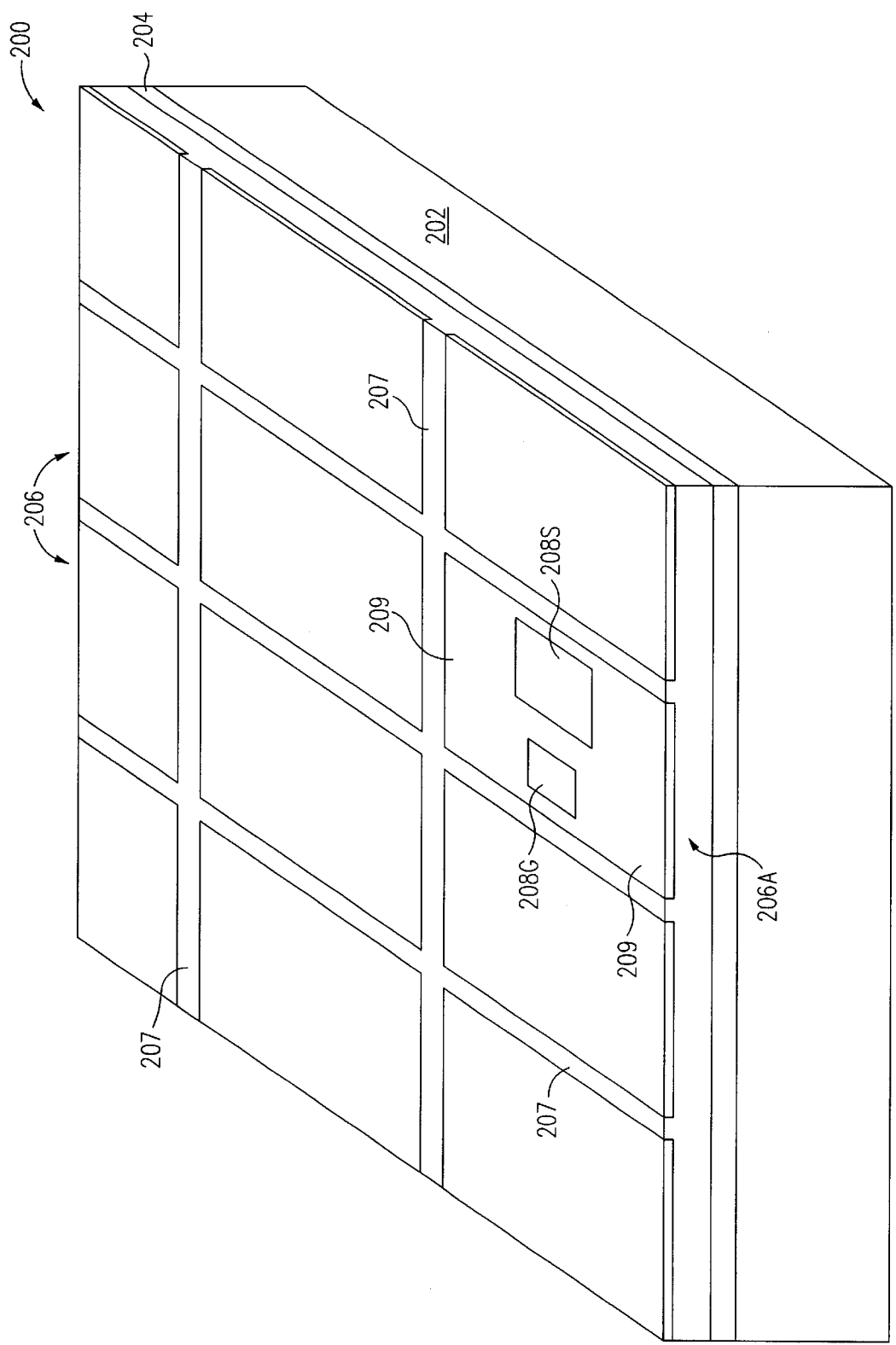
FIG. 2A illustrates a cross-sectional view of a wafer attached to a substrate in accordance with this invention.

After the layer of solderable metal has been deposited, the next step in the process of this invention is illustrated in FIG. 2A, which shows a rectangular section of a semiconductor wafer 200 containing a number of dice 206. The back side of semiconductor wafer 200 is attached to an electrically conductive supporting substrate 202 with a layer of a conductive cement 204. In one embodiment, substrate 202 is made of copper, but it could also be made of any other conductive material capable of providing support and acting as an electrical contact for wafer 200. Cement 204 could be a metallic cement, a silver-filled conductive epoxy or another conductive glue. Wafer 200 is typically silicon but it could also be another semiconductor material such as silicon carbide or gallium arsenide.

Typically, a metal layer (not shown) is formed on the backside of wafer 200 before the cement 204 is applied to provide good adhesion to the cement. For example, the metal layer can include a 500 Å titanium sublayer overlain by a 3,000 Å nickel sublayer and a 1 μm silver sublayer. The titanium, nickel and silver sublayers can be deposited by evaporation or sputtering.

Wafer 200 includes dice 206 which in this embodiment contain power MOSFETs, but as described above dice 206 could alternatively contain bipolar transistors, diodes, JFETs, ICs or any type of vertical or lateral current-flow device. The MOSFETs, bipolar transistors, diodes or other devices are often formed in a two-dimensional array in each of dice 206. As is typical, dice 206 are separated by a perpendicular network of scribe lines 207. Dice 206 have connection pads on their front sides which are exemplified by source pads 208S and gate pads 208G shown in one of dice 206 designated die 206A. There are typically drain pads (not shown) on the backsides of the dice 206. In this embodiment, pads 208S and 208G are located in a central region of die 206A. The portion of the front side of die 206A that is not occupied by pads 208G and 208S is covered by a passivation layer 209. Typically, in the processing of the wafer, openings are etched in the passivation layer to expose the gate and source pads.

As shown in FIG. 2B, an overcoat 210 of polyimide, plastic or glass is formed in the exposed surface of wafer 200 using spin-on, deposition or spray techniques, and overcoat 210 is then patterned using known photolithographic techniques, for example, so as to leave the pads 208S and 208G and portions of passivation layer 209 exposed. Alternatively, the patterned overcoat can be formed by other processes such as screen printing. In one embodiment, screen-printed polyimide is used to form an overcoat that is 1 mil thick.

FIG. 2B shows a view of die 206A after overcoat 210 has been deposited and patterned, leaving pads 208S and 208G and portions of passivation layer 209 exposed. For clarity, the thickness of overcoat 210 is exaggerated in FIG. 2B. As shown, the exposed portions of passivation layer 209 are adjacent to the edges of the die 206A. Overcoat 210 can also be formed of a conductive material such as aluminum or copper, but in that case a nonconductive adhesive layer should be formed between the overcoat and the wafer to ensure that the conductive overcoat does not become shorted to the connection pads 208S and 208G.

Figure 2C:
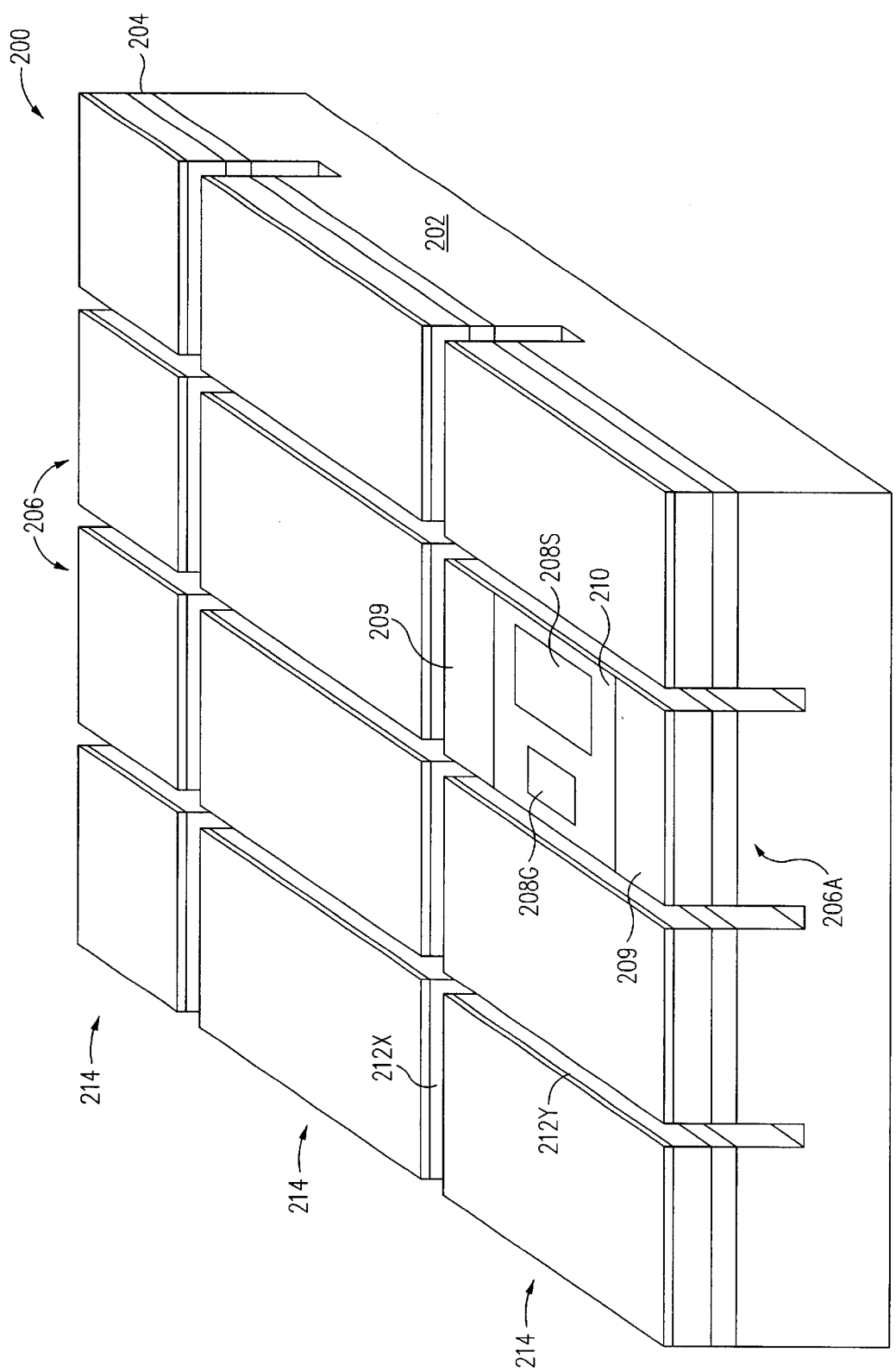
FIG. 2C illustrates the wafer after partial cuts have been made along the scribe lines separating the dice.

Next, if desired, wafer 200 can be screen-printed or laser-marked with markings such as the model number, etc. Then, as shown in FIG. 2C, partial cuts 212X and 212Y are made in the sandwich of wafer 200, overcoat 210 and substrate 202. Partial cuts 212X and 212Y do not extend all the way through the sandwich, but they extend entirely through wafer 200 and overcoat 210 and far enough into substrate 202 that substrate 202 can easily be broken at the locations of partial cuts 212X and 212Y without damaging the dice 206. As shown, partial cuts 212X and 212Y are perpendicular to each other and are made at the locations of the scribe lines 207 between the individual dice 206. Partial cuts 212X and 212Y can be made with a conventional dicing saw or, alternatively, by other methods such as laser cutting or photolithographic patterning and etching techniques.

Wafer 200 and substrate 202 are then broken into multichip strips 214 along partial cuts 212X, each of which contains a row of dice 206. To make sure that the dice 206 are not separated along partial cuts 212Y at this stage, partial cuts 212X can be made somewhat deeper than partial cuts 212Y. For example, in one embodiment partial cuts 212X are 5 mils deeper than partial cuts 212Y. A ceramic breaking machine such as the Tokyo Weld TWA-100 AG III can be used to break the wafer 200 into strips 214.

Alternatively, partial cuts 212Y are not made at this time, and the strips 214 are separated into individual dice at a later stage in the process. Another possibility is that partial cuts 212Y are made before cuts 212X, and cuts 212X can extend all the way through the substrate 202 such that there is no need to break the substrate.

Figure 3:
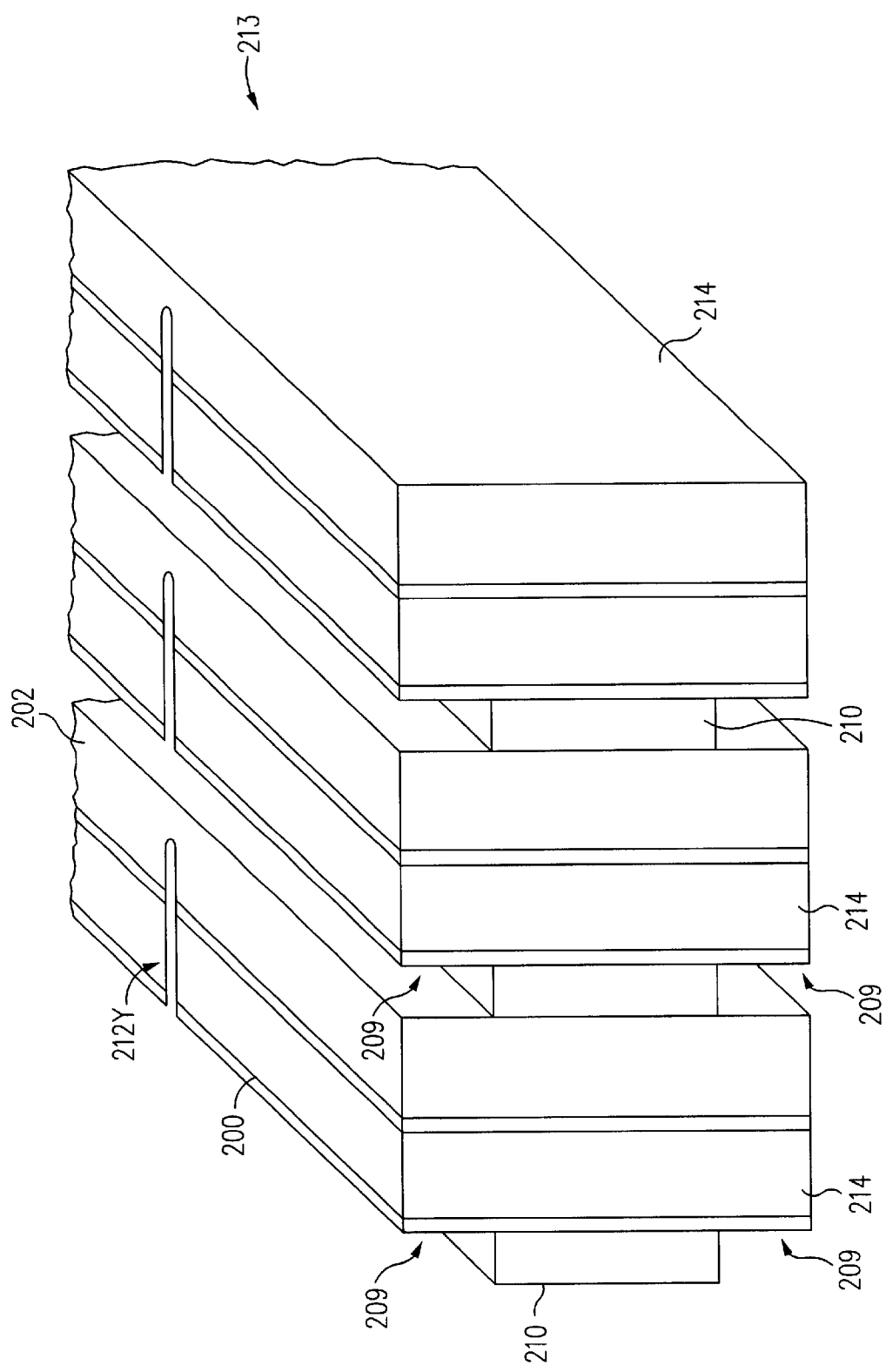
FIG. 3 illustrates a cross-sectional view of strips of dice mounted together to form a stack in accordance with this invention.

Strips 214 are assembled sandwich-like to form a stack 213, as shown in FIG. 3, which is a cross-sectional view taken at the location of one of the cuts 212Y. To form the stack 213, strips 214 can be held against one another in a magazine or other fixture which contains a cavity shaped to hold the strips 214 in place with one edge of the strips 214 exposed. While only three strips 214 are shown in FIG. 3, as many as 50 or 100 or more strips 214 or can be mounted in the stack. FIG. 3 also shows the overcoat 210 (exaggerated in thickness) which covers the surface of wafer 200 except where the pads 208S and 208G and the exposed portions of passivation layer 209 are located. Because of the geometry and locations of the pads, only the exposed portions of passivation layer 209 are exposed when the strips 214 have been arranged together in the stack 213. When the strips 214 are assembled into the stack 213, pads 208S and 208G are in effect sealed off from the external environment.

Figure 4A:
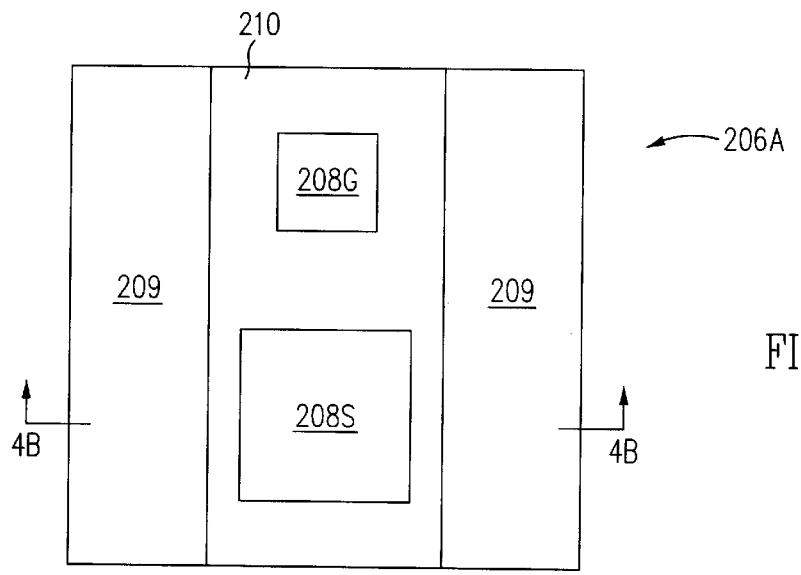
FIGS. 4A and 4B illustrate top and cross-sectional views, respectively, of one of the dice in the stack.
Figure 4B:
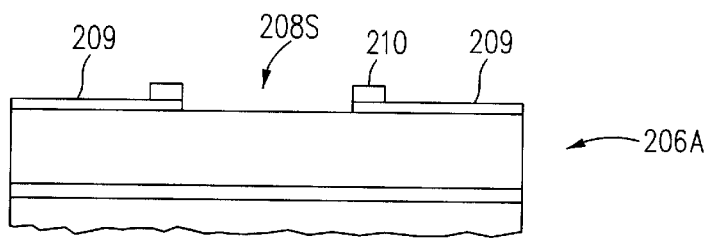

FIG. 4A shows a top view of die 206A in one of strips 214, showing the locations of pads 208S and 208G. Also shown are the exposed portions of passivation layer 209, which are located adjacent an edge of die 206A. FIG. 4B shows a view taken at cross-section 4B—4B in FIG. 4A, showing how overcoat 210 surrounds the source pad 208S. It will be evident that overcoat 210 similarly surrounds the gate pad 208G.

Figure 5:
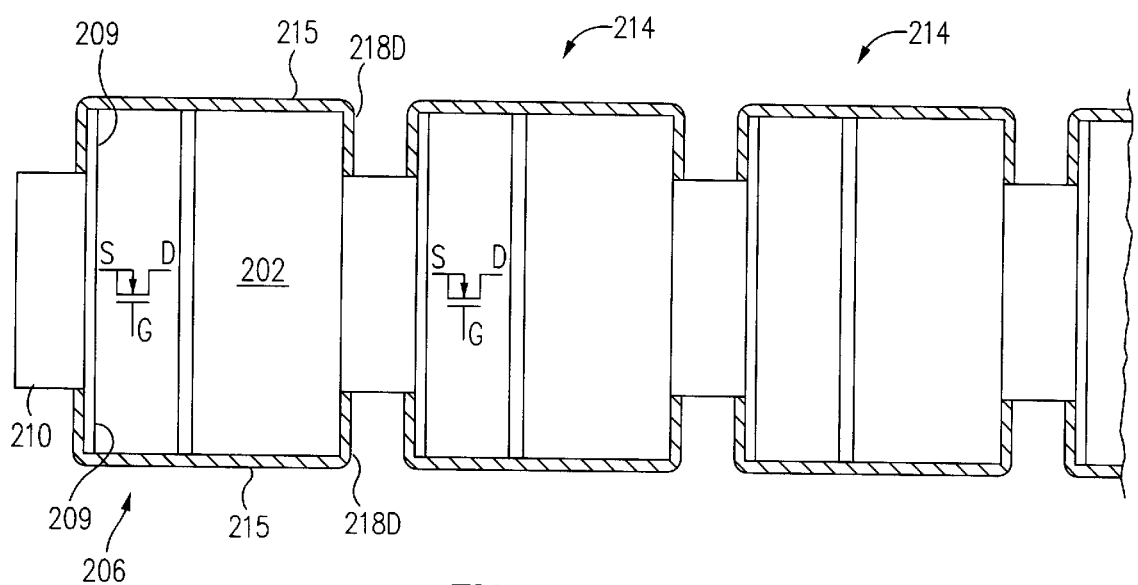
FIG. 5 illustrates a cross-sectional view of three of the dice in the stack, showing how the metal layers are deposited on the pads and wrap around the edges of the dice to establish an electrical connection with a terminal on the back side of the die.

Strips 214 are then exposed to a deposition process by which a first metal layer 215 is sputtered on the exposed portions of passivation layer 209 and on the edges of strips 214, as shown in the cross-sectional view of FIG. 5. Metal layer 215 begins on the front side of the die 206A and extends around the edge of the die 206A to conductive substrate 202, thereby establishing an electrical connection between the front side of die 206A and the drain terminal of the MOSFET (shown symbolically) within dice 206. In this embodiment metal layer 215 contacts both the edge and back side of substrate 202. For example, layer 215 can be a layer of nickel or copper 1000 Å thick. Since, as shown in FIGS. 4A and 4B, pads 208S and 208G are totally enclosed by overcoat 210 and the back side of the adjacent strip 214, the metal does not sputter onto pads 208S and 208G. Alternatively, another process such as evaporation can be used to form metal layer 215.

Metal layer 215 may extend onto the edges of overcoat 210 but this does not create a problem because the strips 214 will later be separated as described below.

The stack 213 is then turned over in the magazine to expose the opposite edges of the dice 206, and the same process is performed to create a similar layer 215 on the opposite sides of the dice 206.

Following the deposition of metal layer 215, stack 213 is disassembled into individual strips 214, and the multichip strips 214 are broken into individual dice 206 along the cuts 212X. Again, a Tokyo Weld TWA-100 AG III ceramic breaking machine can be used to break the strips. Next, the individual dice 206 are placed in a barrel-plating machine such as one manufactured by HBS or American Plating, and an electroplating process is performed to form a second metal layer 216 over the first metal layer 215. Alternatively, other types of electroless plating machines or processes can be used to form second metal layer 216. Metal layer 216 forms only on top of the metal layer 215 and does not adhere to overcoat 210. For example, metal layer 216 can be a one mil thick layer of a solderable metal such as tin/lead. Metal layer 216 thus creates a good electrical connection between the front side of die 206A and the copper substrate 202 along opposite edges of the die.

If the overcoat 210 is formed of a conductive material, as described above a nonconductive adhesive layer is preferably applied to separate the overcoat from the wafer. This nonconductive layer creates a gap between the overcoat and the connection pads and prevents the plated metal layer from creating a short between the overcoat and the connection pads.

In some cases, it may be possible to omit the second metal layer by depositing a relatively thick first metal layer by, for example, sputtering or evaporation. In other embodiments, more than two metal layers may be deposited to make the connection between the front side of the die and the device terminal on the back side of the die. When two or more layers are deposited, the layers can be viewed, in effect, as sublayers in a single wraparound metal "layer".

Figure 6:
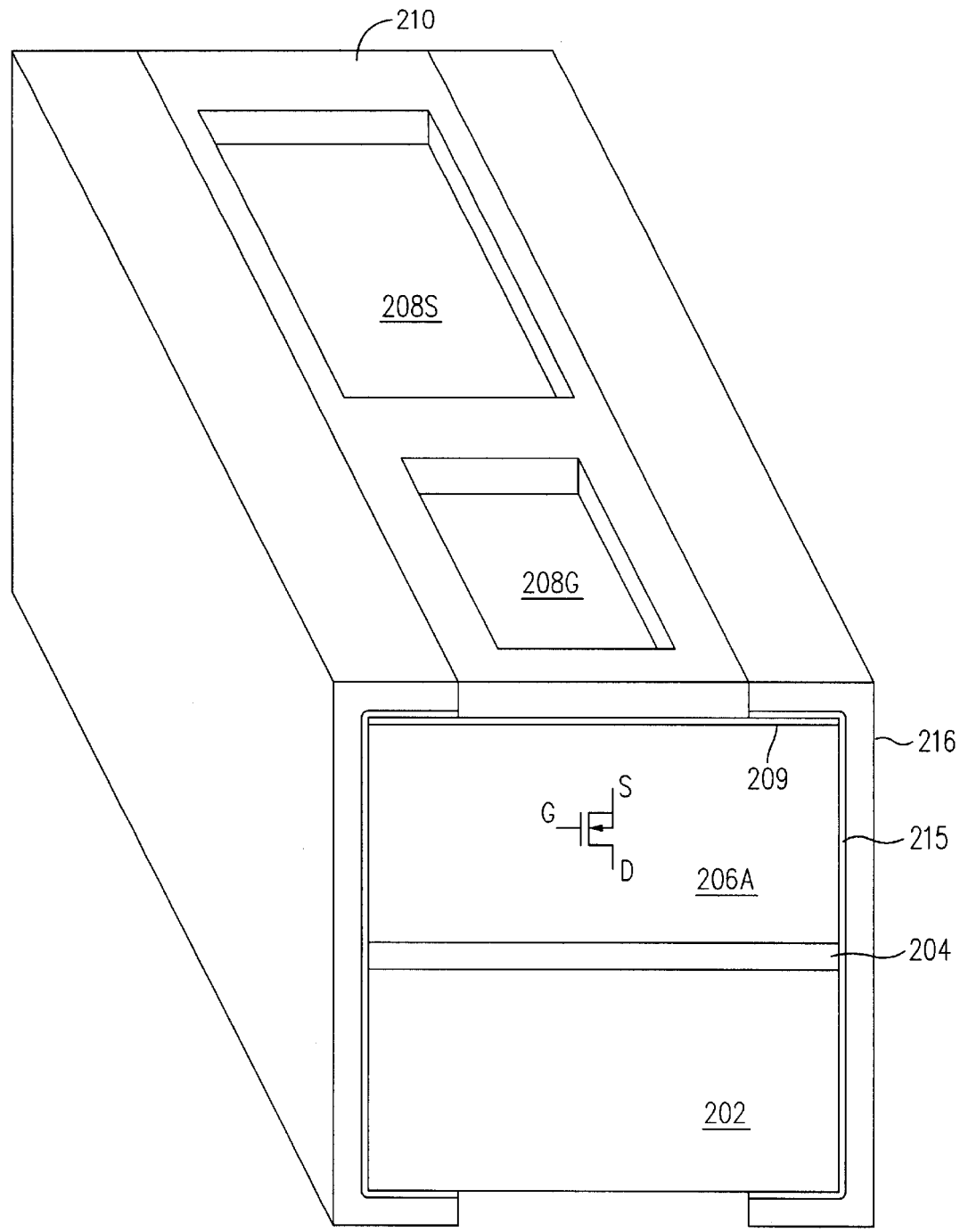
FIG. 6 illustrates a perspective view of the die after the plating process has been completed.

FIG. 6 shows die 206A after the plating process has been completed, with the front side of die 206A being connected to substrate 202 by means of the metal layers 215 and 216. The portion of metal layer 216 on the front side of die 206A becomes in effect a front side "drain pad." Since die 206A contains power MOSFETs, substrate 202 would be in electrical contact with their drain terminals, and thus the front side drain pads would be electrically connected to the drain terminals of the power MOSFETs. Alternatively, if die 206A contained diodes, metal layers 215 and 216 would connect the front side of die 206A to whichever terminals (anodes or cathodes) were located on the back side of the die 206A. Either pad 208G or 208S could be used to connect to the other terminal of the diodes.

As an alternative to assembling die strips 214 into a stack 213 and forming layers 215 and 216 as described above, a wraparound conductive polymer or metal layer functionally similar to layers 215 and 216 can be formed on die strips 214 using, for example, a machine available from the Nitto company of Japan. As another alternative, the electrically conductive wraparound layer connecting the front side of the die and the device terminal on the back side of the die can be formed after the wafer has been separated into individual dice.

Figure 7A:
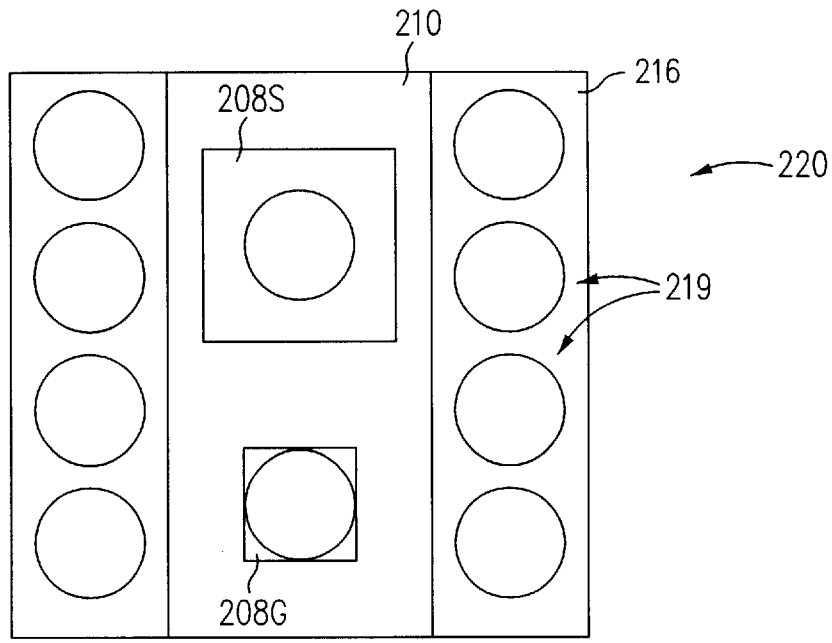
FIGS. 7A and 7B illustrate top and side views, respectively, of the completed semiconductor package including solder balls for making external connections.
Figure 7B:
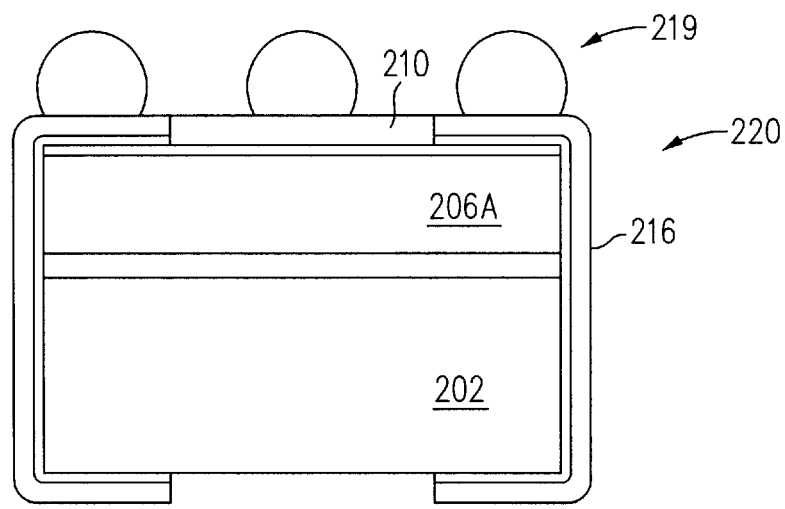

Using a conventional process, solder bumps or balls 219 can then be formed on the pads 208S and 208G and the portions of the metal layer 216 on the front side of die 206A (the "front side drain pad"), producing the completed package 220 shown in the top view of FIG. 7A and the side view of FIG. 7B. The solder balls 219 may be applied in a conventional manner by depositing and reflowing solder paste or by other processes such as screen-printing or solder jetting (using, for example, equipment available from Pac Tech GmbH, Am Schlangenhorst 15–17, 14641 Nauen, Germany) or by using the wafer level solder ball mounter available from Shibuya Kogyo Co., Ltd., Mameda-Honmachi, Kanazawa 920-8681, Japan. Conductive polymer bumps are another alternative, using for example thermosetting polymers, B-state adhesives, or thermoplastic polymers.

Figure 7C:
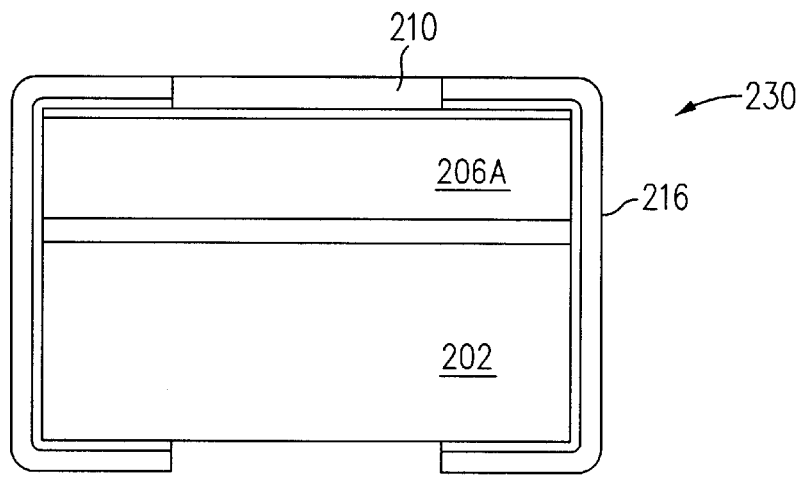
FIG. 7C illustrates a side view of a package similar to the one shown in FIGS. 7A and 7B, except that the solder balls have been omitted.

Package 220 is then mounted on a PCB or other flat surface by the well-known "flip-chip" technique. Alternatively, the solder or polymer bumps or balls 219 can be omitted to produce the package 230 shown in the side view of FIG. 7C.

Figure 8:
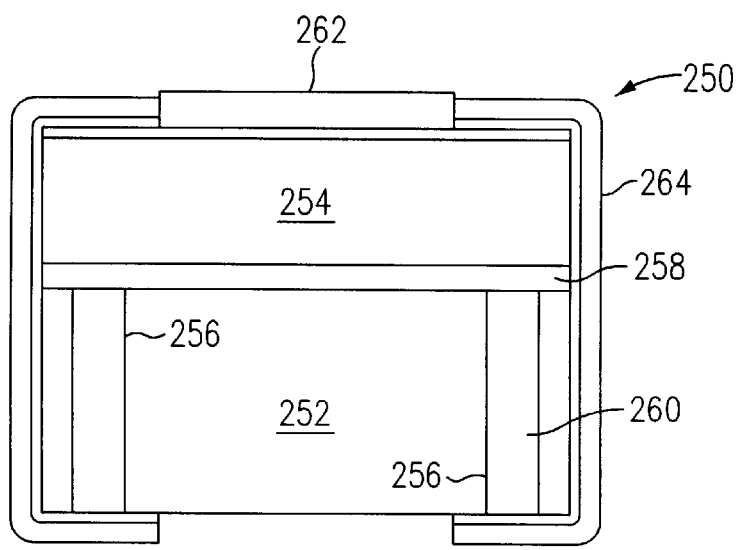
FIG. 8 illustrates a cross-sectional view of an alternative embodiment wherein the supporting substrate is made of a nonconductive material and vias filled with a conductive material are formed in the substrate.

Instead of attaching the wafer to an electrically conductive substrate, a nonconductive substrate can be used to support the wafer, and vias or holes can be formed in the substrate and filled with a conductive material to make electrical contact with the back side of the wafer. FIG. 8 shows a package 250 wherein a nonconductive substrate 252 is attached to the back side of die 254. Vias 256 extend through substrate 252. Vias 256 are filled with a conductive material 260 that is in electrical contact with a layer 258 of conductive cement. Otherwise, the package is similar to the embodiment described above, with an overcoat 262 deposited on the front side of die 254 and metal layers 264 extending around the edges of die 254 and substrate 252 to make electrical contact with the conductive material 260. Substrate 252 could be made of ceramic, aluminum oxide, glass, or plastic. Conductive material 260 could be a metal. Conductive material 260 may also extend through the layer 258 so as to make a direct contact with a terminal on the back side of die 254. Vias 256 could be formed, for example, by drilling, and they could be filled by a plating process, using machines manufactured by 3M or Nikko Denko.

Semiconductor wafers are normally on the order of 15 to 30 mils thick. In order to reduce the resistance between the front and back sides of the wafer, it may to desirable to make the wafer thinner. This can be accomplished by processing the back side of the wafer, e.g., by grinding. To provide proper support for the wafer during the grinding process, the front side of the wafer is bonded to a supporting substrate. After the grinding has been completed, the back side of the wafer is attached to a substrate, in the manner in which wafer 200 is attached to a conductive substrate 202, as shown in FIG. 2A, or a nonconductive substrate 252, as shown in FIG. 8. Thus a sandwich is created, including the thinned wafer interposed between the substrates attached to its front and back sides, respectively. Thereafter, the process described above is applied to the sandwich structure.

Figure 9B:
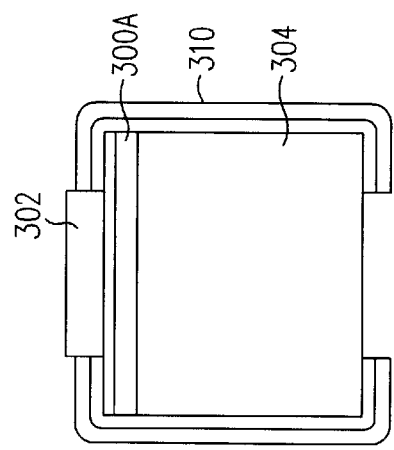
FIG. 9B shows a cross-sectional view of a semiconductor package fabricated by the process shown in FIG. 9A.
Figure 9A:
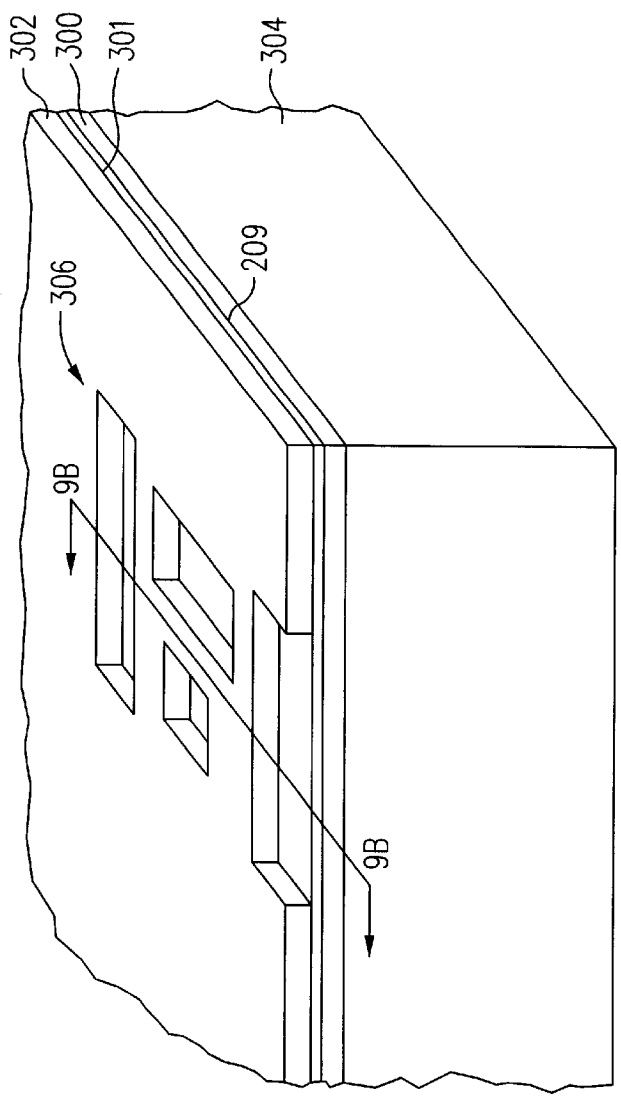
FIG. 9A shows an alternative embodiment wherein a supporting substrate is attached to the front side of the wafer to support the wafer as the back side of the wafer is being ground to make the wafer thinner.

FIG. 9A shows a section of a thinned wafer 300 sandwiched between a front side substrate 302 and a back side substrate 304. Openings 306 have been formed in the front side substrate 302 to provide access to connection pads (not shown) and a portion of the passivation layer on the front side of wafer 300. Front side substrate 302 could be made of glass or copper and is attached to wafer 300 with a layer 301 of a nonconductive cement such as nonconductive epoxy, for example, to prevent shorting between the connection pads. Openings 306 could be formed by etching or by a mechanical means such as stamping or drilling, and openings 306 can be performed in front side substrate 302 before substrate 302 is attached to wafer 300. The back side of wafer 300 is ground with, for example, a grinding machine available from Strausbaugh after wafer 300 is attached to front side substrate 302 but before wafer 300 is attached to back side substrate 304. Wafer 300 may be ground to a thickness of 1–2 mils, for example. As an alternative to grinding, wafer 300 can be thinned by lapping or etching. The use of front side substrate 302 may eliminate the need for an overcoat on the front side of wafer 300, or an overcoat may be applied to the front side of wafer 300 before front side substrate 302 is attached.

The sandwich structure shown in FIG. 9A is processed as described above in, for example, FIGS. 2C, 3, and 5, to produce a semiconductor package having a wraparound metal layer which establishes an electrical connection between the front side of the die and a device terminal on their back side of the die. A cross-sectional view of the resulting package at section 9B—9B is shown in FIG. 9B, with one or more metal layers 310 wrapping around an edge of die 300A to form an electrical connection between the front side of die 300A and a terminal on the back side of die 300A.

While particular embodiments of this invention have been described, these embodiments are illustrative and not limiting. It will be understood by those skilled in the art that many alternative embodiments are possible within the broad scope of this invention.

We claim:

1. A process of fabricating a package for a semiconductor device comprising:

providing a semiconductor wafer including a plurality of dice;

forming an overcoat on a surface on a front side of the wafer;

patterning the overcoat to expose a connection pad on a front side of the dice;

attaching the wafer to a substrate;

separating the wafer into multichip strips, each strip containing a plurality of dice;

assembling the strips sandwich-like to form a stack, with an edge of each die in the stack being exposed;

depositing at least a first metal layer on one side of the stack, the first metal layer wrapping around an edge of a die to form an electrical connection between a location on the front side of the die and a device terminal on a back side of the die;

disassembling the stack into individual strips; and separating a strip into individual dice.

2. The process of claim 1 comprising depositing at least a second metal layer on an opposite side of the stack, the second metal layer wrapping around an opposite edge of the die to form an electrical connection between a second location on the front side of the die and the device terminal on the back side of the die.

3. The process of claim 1 wherein separating the wafer into strips comprises:

cutting through the wafer and through a portion of the substrate along a first set of parallel lines between the dice to form a first set of partial cuts, the substrate remaining intact at a back side of the substrate; and breaking the substrate along the partial cuts.

4. The process of claim 3 wherein cutting comprises sawing.

5. The process of claim 3 wherein cutting comprises photolithographic patterning and etching.

6. The process of claim 3 further comprising cutting through the wafer and through a portion of the substrate between dice along a second set of lines perpendicular to the first set of parallel lines to form a second set of partial cuts before separating the wafer into strips.

7. The process of claim 6 wherein separating a strip into individual dice comprises breaking the strip along the second set of partial cuts.

8. The process of claim 6 wherein the first set of partial cuts is deeper than the second set of partial cuts.

9. The process of claim 1 wherein depositing at least a first metal layer comprises sputtering.

10. The process of claim 1 wherein depositing at least a first metal layer comprises evaporation.

11. The process of claim 1 wherein depositing the first metal layer comprises depositing a first metal sublayer and depositing second metal sublayer over the first metal sublayer.

12. The process of claim 11 wherein depositing the second metal sublayer comprises plating.

13. The process of claim 1 wherein the connection pad located in an interior region of the front side of the die, and wherein assembling the strips to form a stack comprises sealing off the connection pad.

14. The process of claim 1 comprising forming a solder ball in electrical contact with the connection pad.

15. The process of claim 1 wherein the substrate is electrically conductive.

16. The process of claim 15 wherein attaching the wafer to a substrate comprises attaching the wafer to the substrate with an electrically conductive cement.

17. The process of claim 1 wherein the substrate is electrically nonconductive.

18. The process of claim 17 further comprising forming a via entirely through the substrate and filling the via with an electrically conductive material.

19. The process of claim 1 further comprising depositing at least one layer of a solderable metal on the first connection pad.

20. The process of claim 19 further comprising removing an oxide layer before depositing the layer of solderable metal.

21. The process of claim 1 wherein the semiconductor device comprises a MOSFET.

22. The process of claim 1 wherein the semiconductor device comprises a diode.

23. The process of claim 1 wherein the semiconductor device comprises a JFET.

24. The process of claim 1 wherein the semiconductor device comprises a bipolar transistor.

25. The process of claim 1 wherein the semiconductor device comprises an IC.

26. A process of fabricating a package for a semiconductor device comprising:

providing a semiconductor wafer including a plurality of dice;

attaching a front side of the wafer to a first substrate;

processing the back side of the wafer so as to thin the wafer;

creating openings in the first substrate to expose connection pads on a front side of the dice;

attaching a back side of the wafer to a second substrate to form a sandwich containing the wafer interposed between the first and second substrates;

separating the sandwich into strips, each strip containing a plurality of dice;

assembling the strips together to form a stack, with one edge of each die being exposed;

depositing at least a first metal layer on one side of the stack, the first metal layer wrapping around an edge of a die to form an electrical connection between a location on the front side of the die and a terminal on a back side of the die;

disassembling the stack into individual strips; and separating a strip into individual dice.

27. The process of claim 26 wherein processing the back side of the wafer comprises grinding.

28. The process of claim 26 wherein processing the back side of the wafer comprises lapping.

29. The process of claim 26 wherein processing the back side of the wafer comprises etching.

30. A process of fabricating a package for a semiconductor device comprising:

providing a semiconductor wafer including a plurality of dice;

attaching the wafer to a substrate;

forming an overcoat on a surface of the wafer;

patterning the overcoat to expose connection pads on a front side of the dice;

separating the wafer into multichip strips, each strip containing a plurality of dice;

forming an electrically conductive wraparound layer, the wraparound layer wrapping around an edge of the die to form at least a portion of an electrical path between a location on a front side of the die and a device terminal at a back side of the die; and separating the wafer into individual dice.

31. The process of claim 30 wherein the wraparound layer comprises a conductive polymer.

32. The process of claim 30 wherein the wraparound layer comprises a metal.

33. A process of forming an electrical connection between a location on a front side of a semiconductor die and a device terminal at a back side of the die comprising depositing at least one metal layer extending from the location on the front die of the die and around an edge of the die, the at least one metal layer forming at least a portion of an electrical path between the location on the front side of the die and the device terminal at the back side of the die.

34. The process of claim 33 comprising attaching a conductive substrate to the back side of the die, the at least one metal layer being in contact with the substrate.

35. A process of fabricating a package for a vertical power MOSFET comprising:

providing a semiconductor wafer including a plurality of dice;

attaching a back side of the wafer to a conductive substrate;

forming a nonconductive overcoat on a front side of the dice;

patterning the overcoat to expose source and gate pads on the front side of the dice;

separating the wafer into strips, each strip containing a plurality of dice;

assembling the strips sandwich-like to form a stack, with an edge of each die in the stack being exposed;

depositing a first metal layer on one side of the stack, the first metal layer wrapping around an edge of each die to form an electrical connection between a location on the front side of the die and a drain terminal of the MOSFET;

disassembling the stack into individual strips; and plating a second metal layer over the first metal layer.

* * * * *